United States Patent
Hsu et al.

(10) Patent No.: US 10,537,037 B2
(45) Date of Patent: Jan. 14, 2020

(54) ELECTRONIC DEVICE

(71) Applicant: HTC Corporation, Taoyuan (TW)

(72) Inventors: Tzu-Wen Hsu, Taoyuan (TW); Yu-Hsuan Chiu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/862,640

(22) Filed: Jan. 5, 2018

(65) Prior Publication Data
US 2018/0199458 A1    Jul. 12, 2018

Related U.S. Application Data

(60) Provisional application No. 62/442,436, filed on Jan. 5, 2017.

(51) Int. Cl.
| | |
|---|---|
| *H05K 5/03* | (2006.01) |
| *H05K 5/00* | (2006.01) |
| *H05K 5/02* | (2006.01) |
| *B32B 7/02* | (2019.01) |

(52) U.S. Cl.
CPC .............. *H05K 5/03* (2013.01); *B32B 7/02* (2013.01); *H05K 5/0017* (2013.01); *H05K 5/0243* (2013.01); *B32B 2307/402* (2013.01); *B32B 2307/412* (2013.01); *B32B 2457/20* (2013.01)

(58) Field of Classification Search
CPC ...... H05K 5/03; H05K 5/0243; H05K 5/0017; H04M 1/0283; H04M 1/0266; B32B 7/02; B32B 2307/412; B32B 2457/20; B32B 2307/402; G06F 1/1637; G02F 1/133308
See application file for complete search history.

(56) References Cited

U.S. PATENT DOCUMENTS

| | | | | |
|---|---|---|---|---|
| 2010/0128204 | A1* | 5/2010 | Omote | B32B 7/02 349/86 |
| 2010/0208333 | A1* | 8/2010 | Omote | G02F 1/133308 359/320 |
| 2011/0069027 | A1* | 3/2011 | Kim | H04M 1/0283 345/173 |
| 2011/0255000 | A1* | 10/2011 | Weber | G03B 17/02 348/374 |
| 2014/0127442 | A1 | 5/2014 | Ryu et al. | |
| 2014/0192467 | A1* | 7/2014 | Kwong | G06F 1/1601 361/679.3 |
| 2015/0296635 | A1 | 10/2015 | Mycroft et al. | |

(Continued)

OTHER PUBLICATIONS

"Search Report of Europe Counterpart Application", dated May 8, 2018, p. 1-p. 4.

*Primary Examiner* — Steven T Sawyer
*Assistant Examiner* — Sagar Shrestha
(74) *Attorney, Agent, or Firm* — JCIPRNET

(57) ABSTRACT

An electronic device including a display module, a circuit module and a housing is provided. The housing accommodates the display module and the circuit module and includes a transparent cover, a multi-layer stacked structure and a tinted layer. At least a part of the transparent cover presents a curve. The multi-layer stacked structure is disposed on an inner surface of the transparent cover and has a plurality of optical layers stacked in sequence. The tinted layer is disposed on the multi-layer stacked structure. Through the disposition of the multi-layer stacked structure, the housing has variable visual effects.

19 Claims, 7 Drawing Sheets

(56) References Cited

U.S. PATENT DOCUMENTS

2016/0299527 A1* 10/2016 Kwak .................... G06F 1/1626
2017/0202094 A1*  7/2017 Kim ..................... H04B 1/3888
2017/0318690 A1* 11/2017 Jung .................... H05K 5/0017

* cited by examiner

ELECTRONIC DEVICE

CROSS-REFERENCE TO RELATED APPLICATION

This application claims the priority benefit of U.S. provisional application Ser. No. 62/442,436, filed on Jan. 5, 2017. The entirety of the above-mentioned patent application is hereby incorporated by reference herein and made a part of specification.

BACKGROUND

Technical Field

The application relates to a device, and more particularly, to an electronic device.

Description of Related Art

Generally speaking, a housing is required on an electronic device to protect the electronic components within from external damage, such as dust, dirt, water or inappropriate operation. For example, for handheld electronic devices (such as smart phones), the housing protects the handheld electronic device's components such as the camera, lens, and microphone from external influences. However, the colors presented on the common housings do not have visual changes when affected by the influence of ambient light, and are generally more monotonous.

SUMMARY

The application provides an electronic device, a housing thereof has variable visual effects.

An embodiment of the application provides an electronic device including a display module, a circuit module and a housing. The housing is suitable for protecting the display module and the circuit module. The housing includes a first transparent cover, a second transparent cover, a frame, a first multi-layer stacked structure and a first tinted layer. At least a part of the first transparent cover presents a curve. The second transparent cover is opposite to the first transparent cover. The display module is disposed between the second transparent cover and the circuit module. The frame is connected between the periphery of the first transparent cover and the periphery of the second transparent cover. The frame forms an accommodation space with the first transparent cover and the second transparent cover for accommodating the display module and the circuit module. The first multi-layer stacked structure is disposed on a first inner surface of the first transparent cover facing toward the second transparent cover and has a plurality of first optical layers stacked in sequence. The first tinted layer is disposed on the first multi-layer stacked structure.

Based on the above, the first multi-layer stacked structure of the electronic device of the embodiments of the application is disposed on the first inner surface of the first transparent cover facing toward the second transparent cover and has a plurality of first optical layers stacked in sequence, and the first tinted layer is disposed on the first multi-layer stacked structure. When the part of the light of ambience is reflected by the plurality of optical layers of the first multi-layer stacked structure before the light enters the first tinted layer from the side closer to the first transparent cover, other than presenting colors of the first tinted layer, the housing also presents colors of the plurality of optical layers or visual effects (such as visual depth and color gradient) brought by the plurality of optical layers, wherein the colors or visual effects change when viewed from different angles. As such, in this embodiment of the application, the housing of the electronic device has variable visual effects.

To make the above features and advantages of the application more comprehensible, several embodiments accompanied with drawings are described in detail as follows.

DESCRIPTION OF THE EMBODIMENTS

Figure 1:
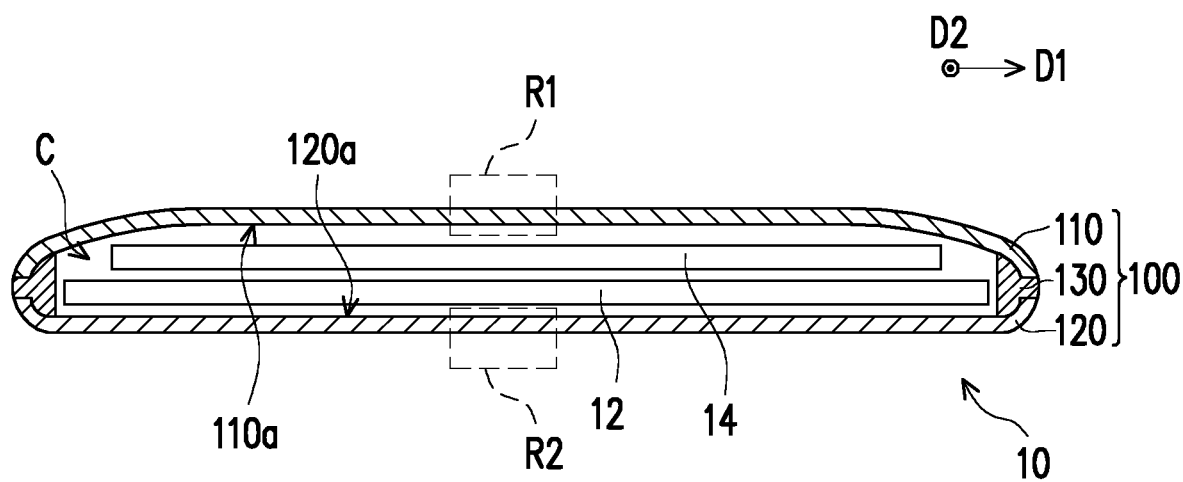
FIG. 1 is a schematic cross-sectional view of an electronic device according to an embodiment of the application.
Figure 2A:
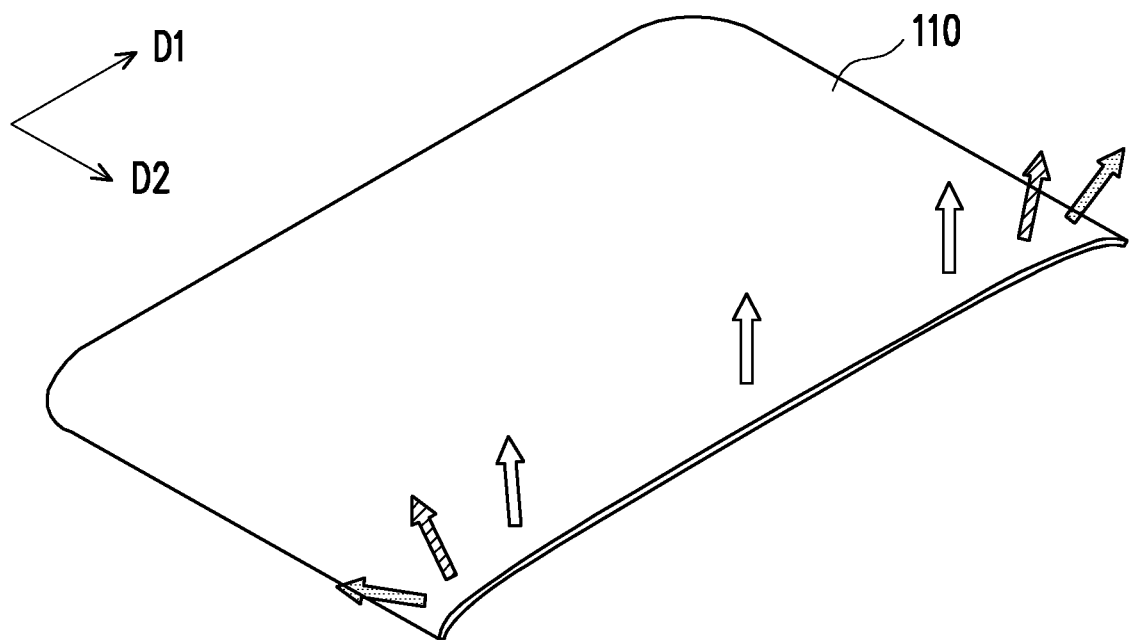
FIG. 2A is a schematic transverse cross-sectional view of a first transparent cover of FIG. 1.
Figure 2B:
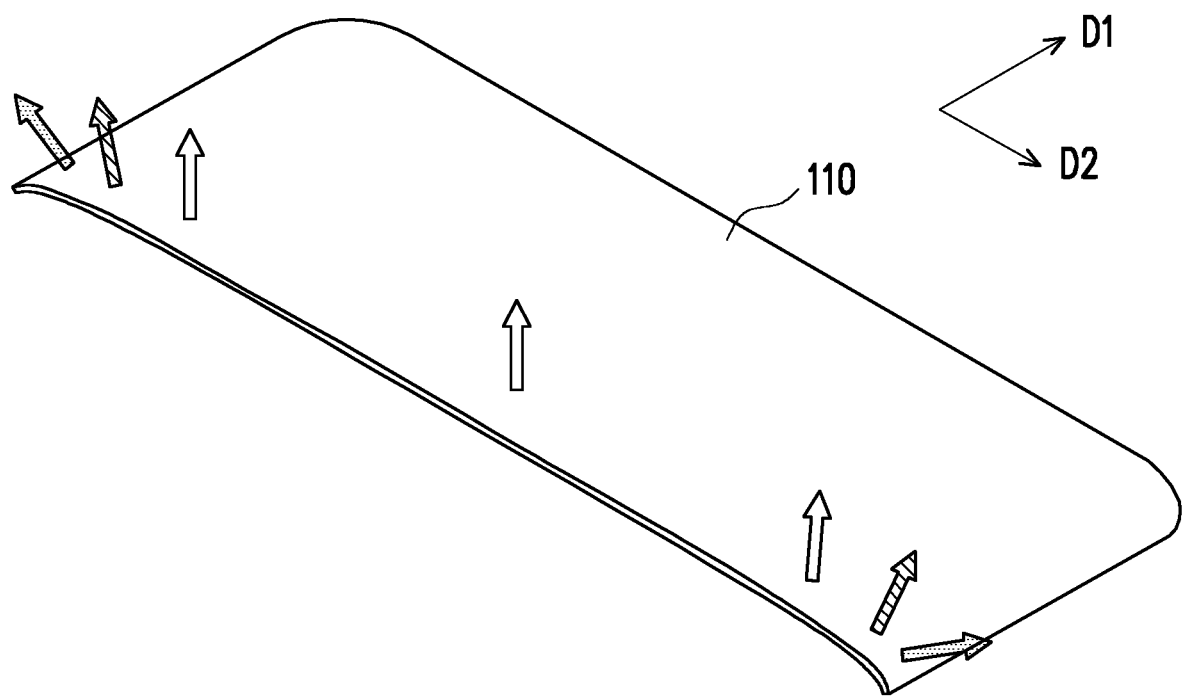
FIG. 2B is a schematic longitudinal cross-sectional view of the first transparent cover of FIG. 1.
Figure 3:
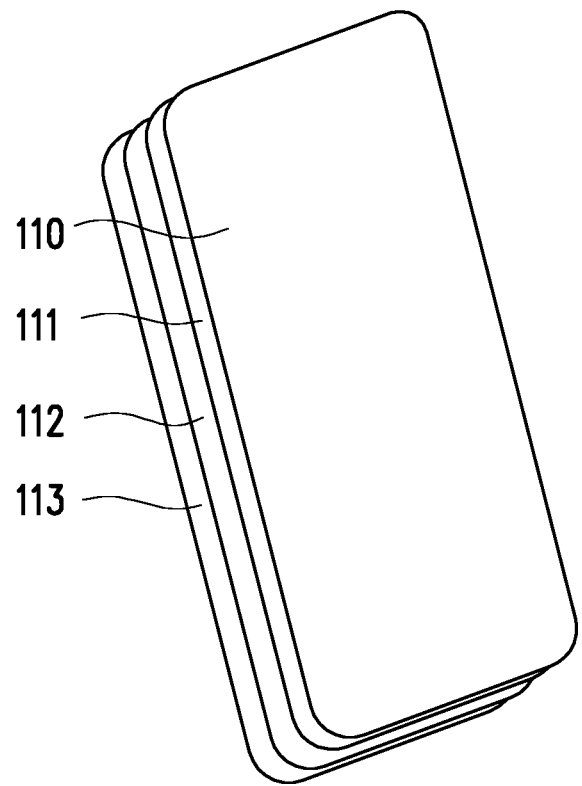
FIG. 3 is an exploded view of the first transparent cover of FIG. 1 and a stack structure disposed thereon.

FIG. 1 is a schematic cross-sectional view of an electronic device according to an embodiment of the application. FIG. 2A and FIG. 2B are respectively a schematic transverse cross-sectional view and a schematic longitudinal cross-sectional view of a first transparent cover 110 of FIG. 1. FIG. 3 is an exploded view of the first transparent cover 110 of FIG. 1 and a stack structure disposed thereon. For clarity, only a part of components of the electronic device are illustrated schematically in FIG. 1. Referring to FIG. 1 to FIG. 3, an electronic device 10 of this embodiment may be a handheld electronic device, such as a smart phone and a tablet computer. The electronic device 10 including a display module 12, a circuit module 14 and a housing 100. The housing 100 is suitable for protecting the display module 12 and the circuit module 14. The housing 100 includes a first transparent cover 110, a second transparent cover 120, a frame 130, a first multi-layer stacked structure 111 (illustrated in FIG. 3) and a first tinted layer 112 (illustrated in FIG. 3). At least a part of the first transparent cover 110 presents a curve (as illustrated in FIG. 2A and FIG. 2B). The second transparent cover 120 is opposite to the first transparent cover 110. The display module 12 is disposed between the second transparent cover 120 and the circuit module 14.

In this embodiment, the frame 130 is connected between the periphery of the first transparent cover 110 and the periphery of the second transparent cover 120. The frame 130 forms an accommodation space C with the first transparent cover 110 and the second transparent cover 120 for accommodating the display module 12 and the circuit module 14. The first multi-layer stacked structure 111 is disposed on a first inner surface 110a of the first transparent cover 110 facing toward the second transparent cover 120 and has a plurality of first optical layers 111a stacked in sequence (illustrated in FIG. 4A with three first optical layers 111a as an example). The first tinted layer 112 is disposed on the first multi-layer stacked structure 111.

In this embodiment, the first transparent cover 110 and the second transparent cover 120 respectively serve as a back cover and a front cover of the electronic device 10. The first transparent cover 110 and the second transparent cover 120 are rectangular, and a material of the first transparent cover 110 and the second transparent cover 120 is glass, plastic or other suitable transparent materials, but the application is not limited thereto.

In this embodiment, the housing 100 further includes a first base layer 113 disposed on the first tinted layer 112. The first base layer 113 may serve as a protection layer of the first multi-layer stacked structure 111 and the first tinted layer 112, avoiding the first multi-layer stacked structure 111 and the first tinted layer 112 from scratching. In this embodiment, the first tinted layer 112 is a translucent layer, and the first base layer 113 is a non-translucent layer. In other embodiments, the first tinted layer 112 and the first base layer 113 may both be translucent layers, or the first tinted layer 112 may be a non-translucent layer as the first base layer 113 may be a translucent layer. Alternatively, the first tinted layer 112 and the first base layer 1131 may both be translucent layers, such that users can vaguely see components within the electronic device 10 through one side of the housing 100.

Referring to FIG. 2A and FIG. 2B again, in this embodiment, the first transparent cover 110 presents a two-dimensional curve. In specific, the first transparent cover 110 presents curves on two ends in a first direction D1 (as illustrated in FIG. 2A) and also presents curves on two ends in a second direction D2 (as illustrated in FIG. 2B), wherein the first direction D1 is perpendicular to the second direction D2.

In other embodiments, the first transparent cover 110 may also present a one-dimensional curve. For example, the first transparent cover 110 presents curves on two ends in the first direction D1 and does not present curves on two ends in the second direction D2. Alternatively, the first transparent cover 110 presents curves on two ends in the first direction D1 and does not present curves on two ends in the second direction D2. In addition, the first transparent cover 110 of the embodiment may presents a flat plane on the central region. In other embodiments, the first transparent cover 110 may also present a one-dimensional curve or a two-dimensional curve on the central region, but the application is not limited thereto.

Figure 4A:
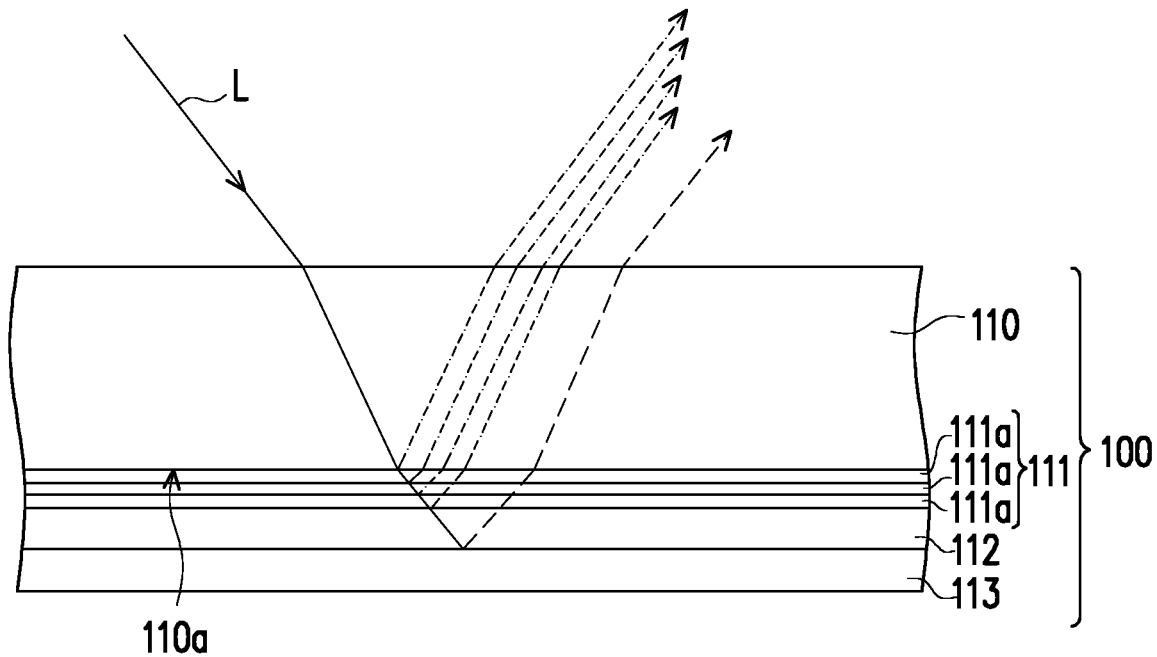
FIG. 4A is a schematic partial enlarged view of an area R in FIG. 1.

FIG. 4A is a schematic partial enlarged view of an area R1 in FIG. 1. Referring to FIG. 4, when a light L of ambience enters a top one of the plurality of first optical layers 111a from a side closer to the first transparent cover 110, a part of the light L reflects as another part of the light L travels through the top one of the plurality of first optical layers 111a to enter the second one of the plurality of first optical layers 111a, and the light L repeats the above steps and finally enters the first tinted layer 112 and the first base layer 113.

In this embodiment, because the part of the light L is reflected by the plurality of optical layers 111a of the first multi-layer stacked structure 111 before the light L enters the first tinted layer 112 from a side closer to the first transparent cover 110, other than presenting colors of the first tinted layer 112 and the first base layer 113, the housing 100 also presents colors of the plurality of optical layers 111a or visual effects (such as visual depth and color gradient) brought by the plurality of optical layers 111a, and the colors or visual effects change when viewed from different angles. As such, the housing 100 presents multi-level of colors or generates special visual effects such as change of visual depth or color gradient.

In addition, materials, densities or colors of at least two of the plurality of optical layers 111a may be different, so the light L reflected by the plurality of optical layers 111a may further have different colors or different visual effects. In this embodiment, a material of the plurality of optical layers 111a includes, for example, nitrogen, carbon and oxygen, etc., or a metallic material may be doped in the plurality of optical layers 111a for the same to present a color. However, the application is not limited thereto.

In this embodiment, at least one of the plurality of first optical layers 111a of the first multi-layer stacked structure 111 is a physical vapor deposition (PVD) layer. In other words, one or more than one of the plurality of first optical layers 111a of the first multi-layer stacked structure 111 is directly deposited on the first transparent cover 110 by a method of physical vapor deposition. As such, compared to being adhered to the first transparent cover 110 by a method of adhesion, even though the first transparent cover 110 presents a non-flat two-dimensional curve, the first multi-layer stacked structure 111 on the two-dimensional curves of the first transparent cover 110 (for example, on the four corners of the first transparent cover 110) does not appear discontinuous or uneven.

Figure 4B:
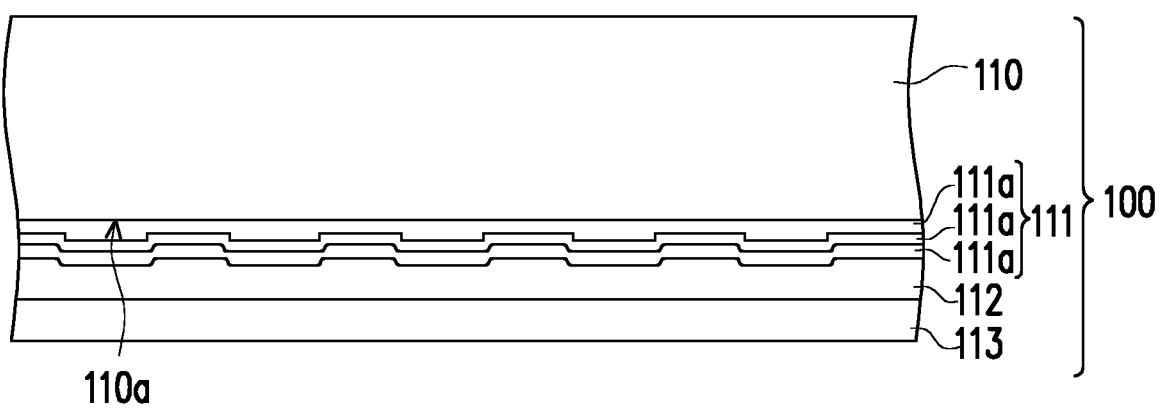
FIG. 4B is a schematic partial enlarged view of a first transparent cover of an electronic device according to another embodiment of the application.

FIG. 4B is a schematic partial enlarged view of a first transparent cover of an electronic device according to another embodiment of the application. The reference numerals and a part of the content of the previous embodiment are used in this embodiment, in which identical reference numerals are applied to indicate identical or similar components, and repeated description of the same technical content is omitted. Referring to FIG. 4B, any one of the plurality of first optical layers 111a of the first multi-layer stacked structure 111 may have different thicknesses in different regions. In specific, when depositing any one of the plurality of first optical layers 111a, through a mask, different regions on the first optical layer 111a have different thicknesses, such that the housing 100 has more variable visual effects. In some embodiments, as described below, through a mask, a thickness of the first multi-layer stacked structure 111 on the center of the first transparent cover 110 is greater than a thickness of the first multi-layer stacked structure 111 on the periphery of the first transparent cover 110, such that the center and the periphery of the housing 100 may have different visual effects or color gradients.

Figure 5:
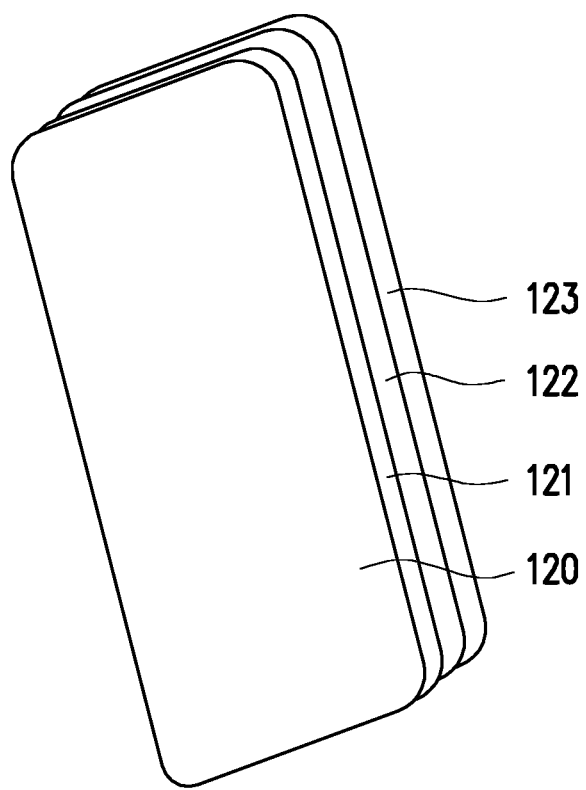
FIG. 5 is an exploded view of the second transparent cover of FIG. 1 and a stack structure disposed thereon.
Figure 6:
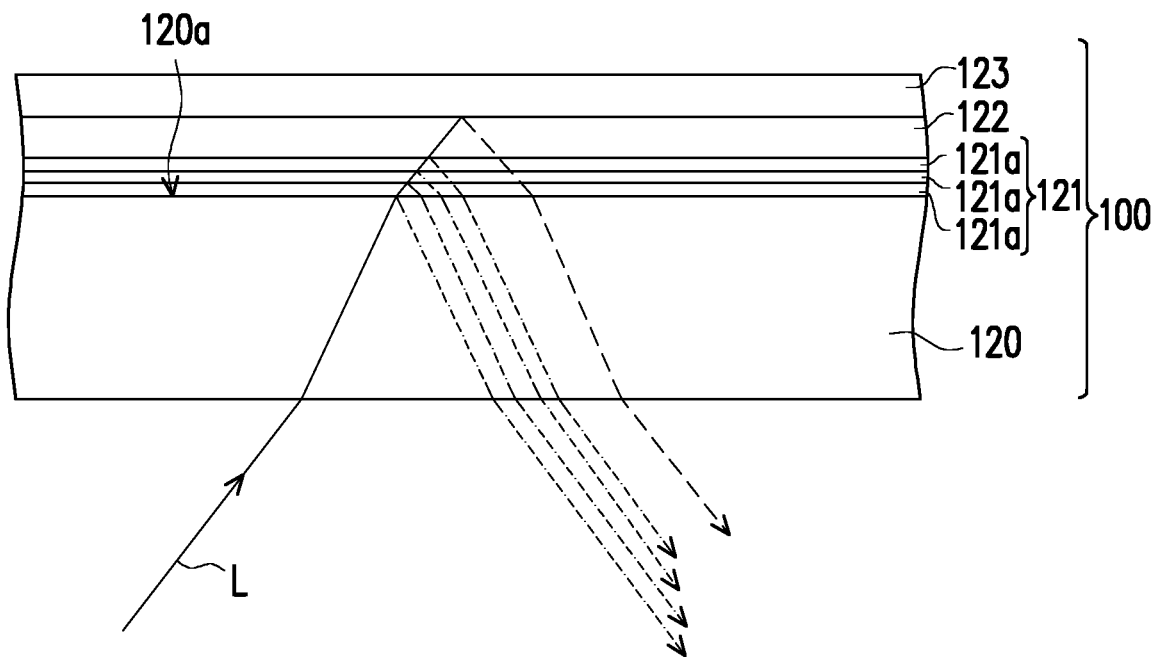
FIG. 6 is a schematic partial enlarged view of another area in FIG. 1.

FIG. 5 is an exploded view of the second transparent cover 120 of FIG. 1 and a stack structure disposed thereon. FIG. 6 is a schematic partial enlarged view of another area R2 in FIG. 1. Referring to FIG. 5 and FIG. 6, in this embodiment, at least a part of the second transparent cover 120 of the housing 100 may present a curve, and the housing 100 may further include a second multi-layer stacked structure 121, a second tinted layer 122 and a second base layer 123. The second multi-layer stacked structure 121 is disposed on a second inner surface of the second transparent cover 120 facing toward the first transparent cover 110 and has a plurality of second optical layers 121a stacked in sequence. The second tinted layer 122 is disposed on the second multi-layer stacked structure 121. The second base layer 123 is disposed on the second tinted layer 122 and is a translucent layer. Related descriptions of the disposition and operation between the second multi-layer stacked structure 121, the second tinted layer 122, the plurality of second optical layers 121a and the second base layer 123 are similar to those of the foregoing first multi-layer stacked structure 111, first tinted layer 112, plurality of first optical layers 111a and first base layer 113, and thus are omitted herein.

In this embodiment, the second transparent cover 120 presents a two-dimensional curve. In specific, the second transparent cover 120 presents curves on two ends in a first direction D1 and also presents curves on two ends in a second direction D2, wherein the first direction D1 is perpendicular to the second direction D2. In other embodiments, the second transparent cover 120 may also present a one-dimensional curve. For example, the second transparent cover 120 presents curves on two ends in the first direction D1 and does not presents curves on two ends in the second direction D2. Alternatively, the second transparent cover 120 presents curves on two ends in the second direction D2 and does not presents curves on two ends in the first direction D1. In addition, the second transparent cover 120 of the embodiment may present a flat plane on the central region. In other embodiments, the second transparent cover 120 may also present a one-dimensional curve or a two-dimensional curve on the central region, but the application is not limited thereto.

Figure 7:
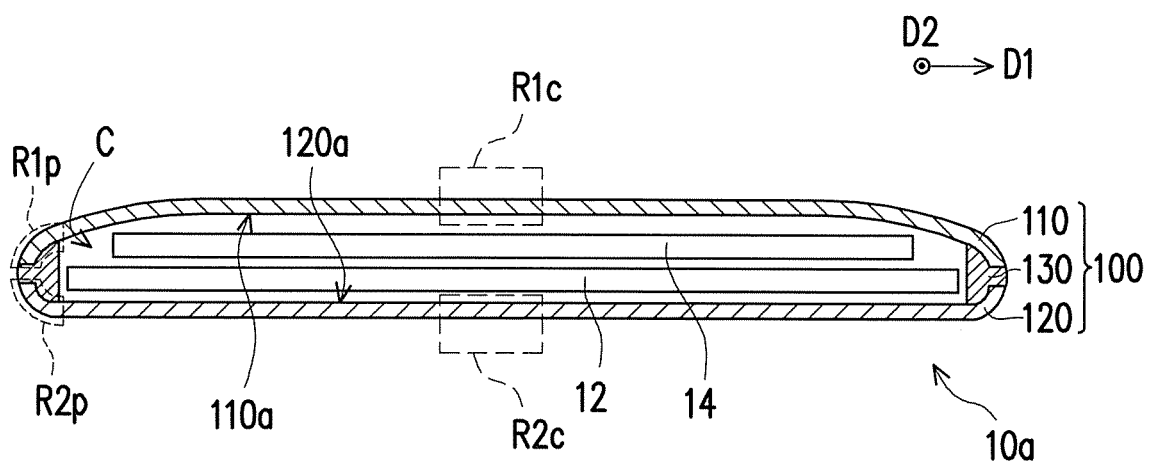
FIG. 7 is a schematic cross-sectional view of an electronic device according to another embodiment of the application.

FIG. 7 is a schematic cross-sectional view of an electronic device according to another embodiment of the application. In the present embodiment, an electronic device 10a is similar to the electronic device 10 in FIG. 1, only the differences are described hereinafter.

Figure 8A:
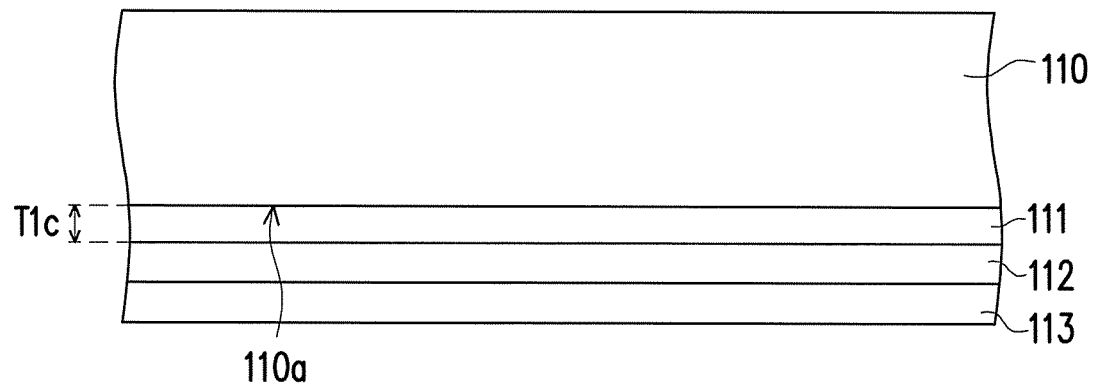
FIG. 8A is a schematic partial enlarged view of an area R1$c$ in FIG. 7.
Figure 8B:
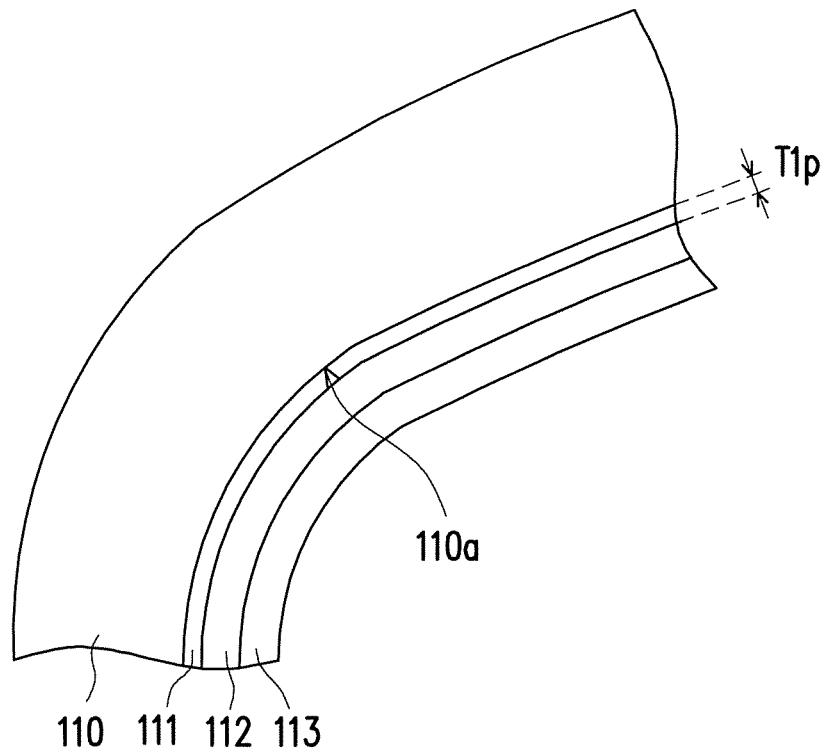
FIG. 8B is a schematic partial enlarged view of an area R1$p$ in FIG. 7.
Figure 8C:
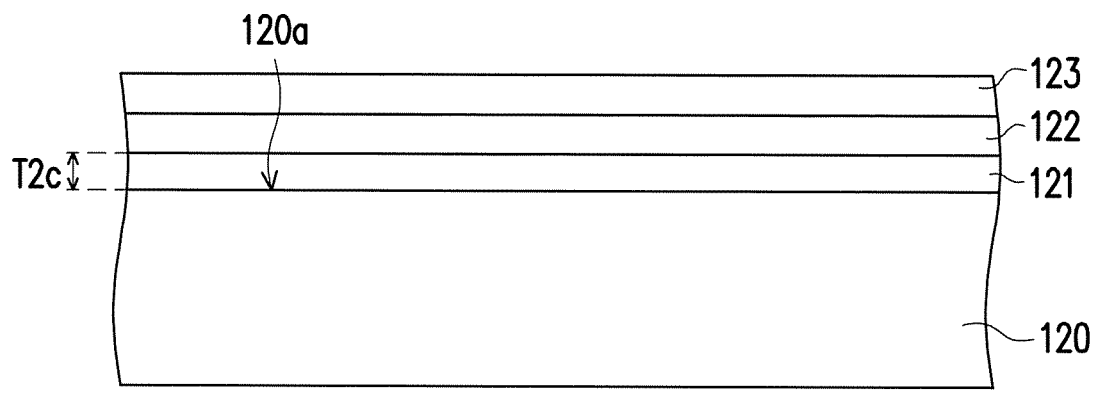
FIG. 8C is a schematic partial enlarged view of an area R2$c$ in FIG. 7.
Figure 8D:
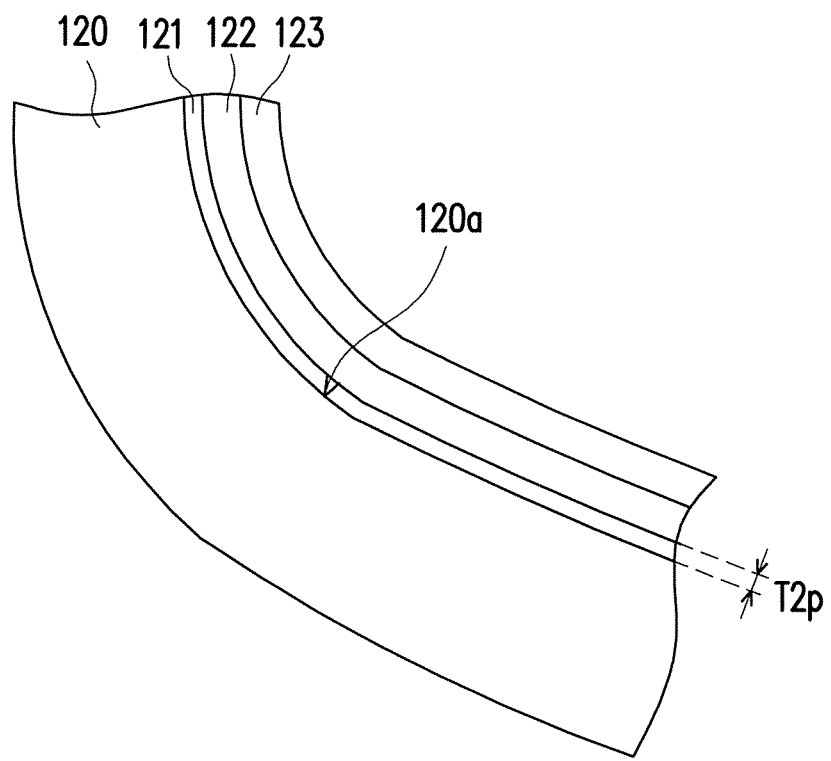
FIG. 8D is a schematic partial enlarged view of an area R2$p$ in FIG. 7.

FIG. 8A is a schematic partial enlarged view of an area R1c in FIG. 7. FIG. 8B is a schematic partial enlarged view of an area R1p in FIG. 7. FIG. 8C is a schematic partial enlarged view of an area R2c in FIG. 7. FIG. 8D is a schematic partial enlarged view of an area R2p in FIG. 7. The area R1c is the area on the center of the first transparent cover 110, and the area R1p is the area on the periphery of the first transparent cover 110. In addition, the area R2c is the area on the center of the second transparent layer 120, and the area R2p is the area on the periphery of the second transparent layer 120.

As shown in FIGS. 8A and 8B, a thickness T1c of the first multi-layer stacked structure 111 on the center of the first transparent cover 110 is greater than a thickness T1p of the first multi-layer stacked structure 111 on the periphery of the first transparent cover 110. Similarly, as shown in FIGS. 8C and 8D, a thickness T2c of the second multi-layer stacked structure 121 on the center of the second transparent cover 120 is greater than a thickness T2p of the second multi-layer stacked structure 121 on the periphery of the second transparent cover 120. Therefore, the center and the periphery of the housing 100 may have different visual effects or color gradients.

In sum of the foregoing, the first multi-layer stacked structure of the electronic device of the embodiments of the application is disposed on the first inner surface of the first transparent cover facing toward the second transparent cover and has a plurality of first optical layers stacked in sequence, and the first tinted layer is disposed on the first multi-layer stacked structure. When the part of the light of ambience is reflected by the plurality of optical layers of the first multi-layer stacked structure before the light enters the first tinted layer from a side closer to the first transparent cover, other than presenting colors of the first tinted layer, the housing also presents colors of the plurality of optical layers or visual effects (such as visual depth and color gradient) brought by the plurality of optical layers, and the colors or visual effects change when viewed from different angles. As such, the housing of the electronic device of the embodiments of the application has variable visual effects. In addition, the plurality of first optical layers of the first multi-layer stacked structure is directly deposited on the first transparent cover by a method of physical vapor deposition. As such, compared to being adhered to the first transparent cover by a method of adhesion, even though the first transparent cover 110 presents a non-flat two-dimensional curve, the first multi-layer stacked structure on the two-dimensional curves of the first transparent cover (for example, on the four corners of the first transparent cover) does not appear discontinuous or uneven.

Although the application has been disclosed by the above embodiments, the embodiments are not intended to limit the application. It will be apparent to those skilled in the art that various modifications and variations can be made to the structure of the application without departing from the scope or spirit of the application. Therefore, the protecting range of the application falls in the appended claims.

What is claimed is:

1. An electronic device, comprising:
   a display module;
   a circuit module; and
   a housing suitable for protecting the display module and the circuit module, the housing comprising:
      a first transparent cover, at least a part of the first transparent cover presenting a curve;
      a second transparent cover opposite to the first transparent cover, wherein the display module is disposed between the second transparent cover and the circuit module;
      a frame connected between the periphery of the first transparent cover and the periphery of the second transparent cover, wherein the frame forms an accommodation space with the first transparent cover and the second transparent cover for accommodating the display module and the circuit module;
      a first multi-layer stacked structure disposed on a first inner surface of the first transparent cover facing toward the second transparent cover and having a plurality of first optical layers stacked in sequence, wherein the first multi-layer stacked structure has different thicknesses in different regions; a first tinted layer disposed on the first multi-layer stacked structure;
   wherein at least a part of the second transparent cover presents a curve, and the housing further comprises: a second multi-layer stacked structure disposed on a second inner surface of the second transparent cover facing stacked in sequence; and a second tinted layer disposed on the second multi-layer stacked structure.

2. The electronic device according to claim 1, wherein the housing further comprises:
   a first base layer disposed on the first tinted layer.

3. The electronic device according to claim 2, wherein the first base layer is a translucent layer.

4. The electronic device according to claim 2, wherein the first base layer is a non-translucent layer.

5. The electronic device according to claim 1, wherein at least one of the plurality of first optical layers is a physical vapor deposition layer.

6. The electronic device according to claim 1, wherein the first transparent cover presents a curved surface that is bent about one-dimensional axis.

7. The electronic device according to claim 1, wherein the first transparent cover presents a two-dimensional curve.

8. The electronic device according to claim 1, wherein densities of at least two of the plurality of first optical layers are different.

9. The electronic device according to claim 1, wherein colors of at least two of the plurality of first optical layers are different.

10. The electronic device according to claim 1, wherein a thickness of the first multi-layer stacked structure on the center of the first transparent cover is greater than a thickness of the first multi-layer stacked structure on the periphery of the first transparent cover.

11. The electronic device according to claim 1, wherein the first transparent cover and the second transparent cover are rectangular.

12. The electronic device according to claim 1, wherein a material of the first transparent cover and the second transparent cover is glass or plastic.

13. The electronic device according to claim 1, wherein the housing further comprises: a second base layer disposed on the second tinted layer.

14. The electronic device according to claim 1, wherein at least one of the plurality of second optical layers is a physical vapor deposition layer.

15. The electronic device according to claim 1, wherein the second transparent cover presents a curved surface that is bent about one-dimensional axis.

16. The electronic device according to claim 1, wherein the second transparent cover presents a two-dimensional curve.

17. The electronic device according to claim 1, wherein densities of at least two of the plurality of second optical layers are different.

18. The electronic device according to claim 1, wherein colors of at least two of the plurality of second optical layers are different.

19. The electronic device according to claim 1, wherein a thickness of the second multi-layer stacked structure on the center of the second transparent cover is greater than a thickness of the second multi-layer stacked structure on the periphery of the second transparent cover.

* * * * *